Figure 3:
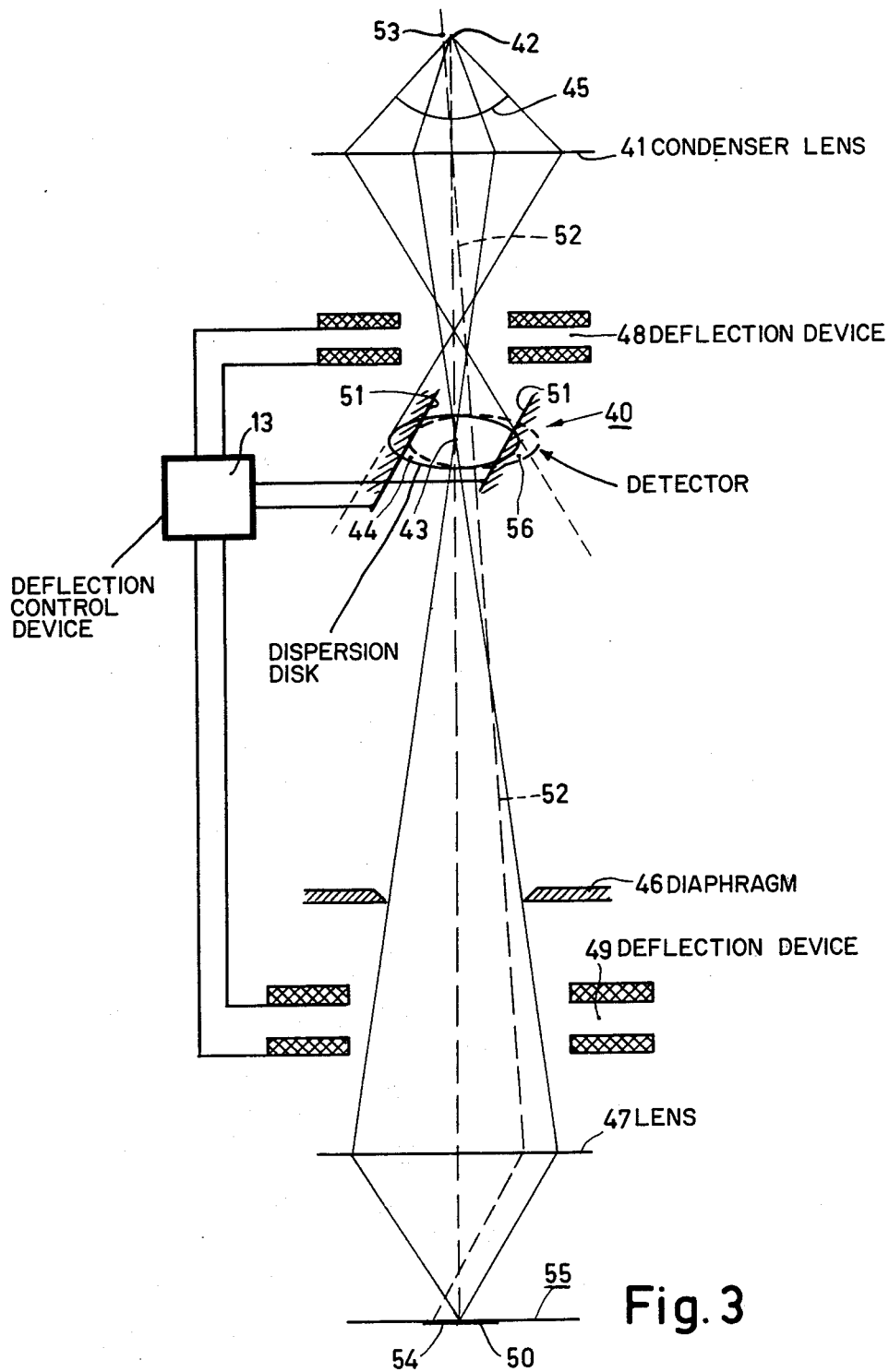

United States Patent [19]

van Oostrum et al.

[11] 4,071,765
[45] Jan. 31, 1978

[54] ELECTRON MICROSCOPE

[75] Inventors: Karel Jan van Oostrum; Gerardus Gegorius Petrus van Gorkom, both of Eindhoven, Netherlands

[73] Assignee: U.S. Philips Corporation, New York, N.Y.

[21] Appl. No.: 639,863

[22] Filed: Dec. 11, 1975

[30] Foreign Application Priority Data

Dec. 17, 1974 Netherlands .................. 7416395

[51] Int. Cl.² ............................................. H01J 37/26
[52] U.S. Cl. ..................................... 250/397; 250/311
[58] Field of Search .................. 250/311, 396, 397

[56] References Cited

U.S. PATENT DOCUMENTS

| | | | |
|---|---|---|---|
| 3,576,438 | 4/1971 | Pease | 250/311 |
| 3,767,927 | 10/1973 | Rus et al. | 250/311 |
| 3,795,809 | 3/1974 | Takashima | 250/397 |
| 3,872,305 | 3/1975 | Koike | 250/311 |
| 3,927,321 | 12/1975 | Welter | 250/311 |

Primary Examiner—Bruce C. Anderson
Attorney, Agent, or Firm—Frank R. Trifari

[57] ABSTRACT

In an electron beam apparatus corrections are made for vibrations and field disturbances which cause a lateral beam shift. A detector is arranged in an intermediate image near the beam path and a signal derived therefrom is used for controlling a beam deflection device. When a second beam deflection device is added, the undesired deflection in a scanning electron microscope can be distinguished from the deflection caused by the scanning.

9 Claims, 3 Drawing Figures

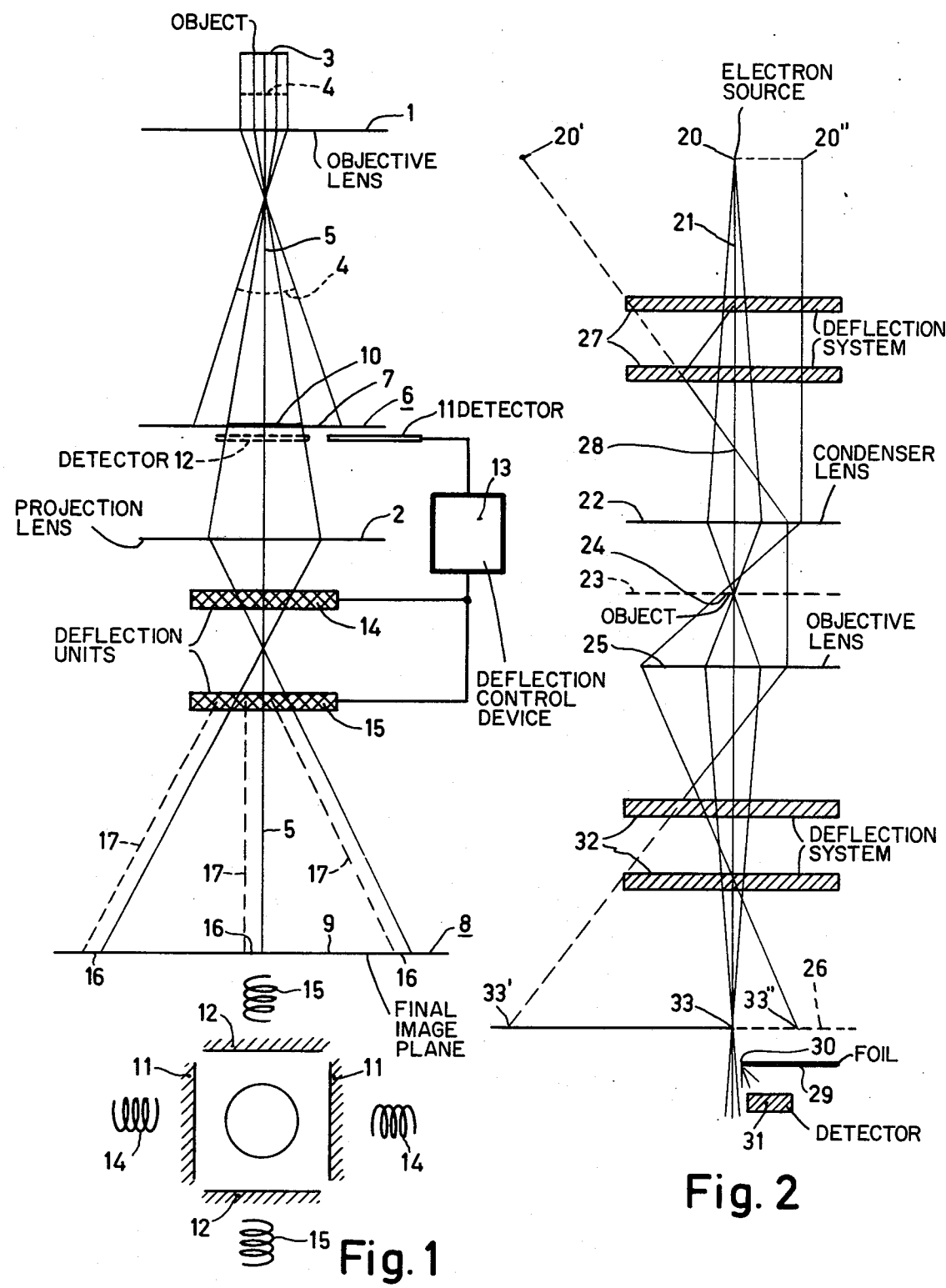

ELECTRON MICROSCOPE

The invention relates to an electron beam apparatus comprising an electron-optical lens system and an electron detection device which is arranged at least near a beam path for an electron beam occurring in the electron beam apparatus.

An electron beam apparatus of this kind is known, for example, from U.S. patent application Ser. No. 174,657 filed Aug. 25, 1971. In a high-voltage microscope described therein the acceleration voltage for the electron beam is stabilized by means of an electron detector. The invention has for its object the reduction of disturbing movements of the electron beam with respect to an object or a target by means of a signal obtained from a detector which is arranged in or at least tangent to the beam path in an electron beam apparatus. For known electron beam apparatus, particularly high-resolution apparatus, very severe constructions and assembly instructions must be satisfied for this purpose; very severe requirements are imposed particularly as regards the object holder. In scanning microscopes it is desirable to avoid movement of an image of the source which is either caused by mechanical vibrations of the source itself or by magnetic or electrical disturbances in the imaging field.

The invention has for its object the provision of an electron beam apparatus wherein these expensive steps can be dispensed with. To this end, an electron beam apparatus of the kind set forth according to the invention is characterized in that the detection device is arranged at least near an intermediate image to be formed by the lens system and forms part, together with a beam deflection device, of a beam correction device of the electron beam apparatus.

In an electron beam apparatus according to the invention, therefore, it is not attempted to make a vibration free mounting of the object of the source, but rather to produce a well-defined and non-distorted image of the object of the source by compensating the beam position for vibrations or disturbances. In this context it is not relevant as to how the image is formed or what information is contained in the image.

In a preferred embodiment in accordance with the invention, the detector in a transmission electron microscope is arranged in an intermediate image of an object which is formed by the objective lens of the lens system, the beam deflection system controlled by the detector signal being arranged between the projection lens and a target screen. In a further preferred embodiment in accordance with the invention, a detector comprising a sharp-edged gold foil is arranged in a scanning electron microscope in the intermediate image plane of the objective lens, the excitation of a beam deflection device being readjusted for the scanning by means of signals from this detector. The movement of the electron beam in the detection plane, caused by the desired scanning of the object, is then completely reduced by means of a second beam deflection device. In a further preferred embodiment yet, a detection device is arranged in an image plane of a condenser lens which forms part of a scanning microscope, an electron beam machining apparatus, or an electron beam recording apparatus.

Some preferred embodiments in accordance with the invention will be described in detail hereinafter with reference to the drawing.

FIG. 1 diagrammatically shows a beam path in a transmission electron microscope comprising a beam correction device in accordance with the invention, FIG. 2 diagrammatically shows a beam path in a scanning transmission electron microscope comprising a beam correction device in accordance with the invention.

FIG. 3 diagrammatically shows a beam path in a scanning electron microscope comprising a beam correction device in accordance with the invention.

FIG. 1 shows an objective lens 1 and a projection lens 2 of a lens system of a transmission microscope. Viewed in the direction of an electron beam to be used, an object 3 is situated before the objective lens in a beam path 4 having an optical axis 5. The object 3 or at least a portion thereof is imaged in enlarged form in an intermediate image plane 6 in the objective lens 1. From an image 7 formed at this area a final image 9 is formed in a final image plane 8 by the projection lens 2. Usually only a central portion 10 of the intermediate image 7 then contributed to the formation of the final image. In the intermediate image plane 6 there is arranged a detection device which in this case comprises, for example, two detectors 11 and 12 which are partly arranged in the beam path, preferably in mutually perpendicular directions, and which are coupled to a deflection control device 13. A detection device of this kind, comprises, for example, semiconductor detectors, scintillation crystals with light detectors or electron-dispersing foils with detectors arranged in the vicinity. The deflection control device 13 also has connected thereto two beam deflection units 14 and 15, each of which is capable of effecting a beam deflection in two mutually perpendicular directions. For the deflection of the electron beam, use can be made of a beam deflection device as described, for example, in U.S. patent application Ser. No. 174,887 filed Aug. 25, 1971. The deflection direction of each of the detectors or the direction of the resultant of the two deflection directions is then dependent of the angle co-ordinates of the detectors 11 and 12 as well as of the beam rotation occurring between the detector plane and the deflection plane. Using these deflection devices, compensation can be made for a shift 16 in the final image 9, caused by a shift of the object due to vibrations in the object holder, by a corresponding lateral displacement of the imaging beam as denoted by the dotted line 17. The deflection device can alternatively be arranged between the objective lens and the detectors. A readjusting beam deflection device is then obtained. The larger field of vision of the objective lens with respect to the field of vision of the projection lens is advantageous, because the detectors can thus be arranged completely outside the final image. It is advantageous to make, for example, a well-defined transition from a non-transparent or less transparent portion of the object itself or of a carrier for the object, coincide exactly with the edge of the detector in the intermediate image plane. The beam deflection device in accordance with the invention can then also be used for displacing the image in the image plane over a comparatively short distance. This can be utilized, for example, for exact positioning of an image of the object in the final image plane. Merely a field from the object must then be adjusted by means of the object holder. For this comparatively coarse adjustment, use can be made of a substantially simpler object holder.

The detectors as well as the beam deflection units can alternatively be arranged elsewhere in the electron microscope. It is not necessary to arrange the deflection device behind the detector device, viewed in the direction of the electron beam. The detectors can also be arranged, for example, in the final image plane, the deflection device again being arranged, for example, between the objective lens and the detectors. It is advantageous to add small, non-transparent or almost non-transparent particles, for example gold or tungsten particles, to the object, and to make an edge of an image of such a particle coincide with the edge of a detector in the final image plane.

FIG. 2 shows a beam path of a preferred embodiment in accordance with the invention in the form of a scanning transmission electron microscope. The figure diagrammatically shows an electron source 20 for generating an electron beam 21, a condenser lens 22, an object plane 23 with an object 24, an objective lens 25 and an intermediate image plane 26. The intermediate image plane 26 is in this case formed by the image plane of the objective lens. Furthermore, a first beam deflection system 27 is arranged about the electron beam. A scanning movement can be imparted thereby to the electron beam 21 in known manner. The condenser lens forms a reduced image (focal spot) of the electron source 20 in the object plane 23. An object 24 arranged in this plane is scanned by means of this focal spot. An object focal spot 28 of the condenser lens acts as a cross-over for the electron beam. The electron source 20 is apparently displaced during this scanning. In a given position during scanning the source 20 is situated in the position 20', viewed from the object. Besides this desired apparent source shift, real displacements of the source 20 also occur, for example, due to vibrations of the apparatus. FIG. 2 shows such a real displacement of the source 20 to the position 20". Due to these undesired source movements, a disturbance occurs which becomes manifest as lack of definition or distortion in an image to be displayed. In accordance with the invention, this disturbance is eliminated by arranging a detector device in the beam path and by controlling a beam deflection device 40 by means of a signal derived therefrom. In the preferred embodiment shown, the detector device is arranged in the intermediate image plane 26, an electron interception device, for example, composed of a foil 29, being provided for each of the two deflection devices. These foils are preferably made of gold and face the beam axis with a well-defined boundary 30. In the vicinity of the gold foil there is arranged a detector 31 which is sensitive to electrons and which intercepts electrons dispersed by the gold foil. For realignment of the beam, the beam deflection device 27 already present can be used. This beam is then controlled by an additional excitation, i.e. besides the excitation for the scanning. Correction again takes place in two mutually perpendicular directions, and any rotation of the image-forming beam between the detector device and the deflection device must be taken into account. In order to enable an undesired deviation to be distinguished from normal scanning in the image plane 26, a second beam deflection device 32 is provided. The electron beam is deflected back thereby in synchronism with the first beam deflection device during scanning, with the result that a point of incidence of the beam on the image plane 26 is always situated in a fixed point 33 which is preferably situated on the optical axis. It is indicated in the beam path how a point of incidence 33' which would arise for an apparatus position of the source 20' due to the scanning motion, is returned to a point 33 on the optical axis. As a result, in the image plane 26 only non-desired shifts of the beam target position, i.e. not caused by the scanning, are detected by the detector device.

In a further preferred embodiment, for which FIG. 3 shows a beam path, a detection device 40 is arranged in or near a plane wherein a source 42 is imaged by a condenser lens 41. For this imaging process a dispersion disc 44 is formed, for example, by spherical aberration of the condenser lens besides a paraxial imaging of the electron source 42 about an axis point 43. The non-paraxial portion of an electron beam 45 is usually screened by a diaphragm 46 arranged between this image plane and a subsequent lens 47. When the detector device is arranged in the edge area of the dispersion disc 44, the detection according to the invention utilizes electrons which would not have reached the object, even if no detection device were used. As a result, the final image is not disturbed by the detectors, while due to the fixed position of the dispersion disc with respect to the paraxial image, proper position information of the beam is obtained. When a signal thus obtained is applied to a beam deflection system 48, disturbing beam deviations can be completely reduced.

The correction signal can alternatively be used for applying an additional excitation to a second beam deflection device 49 which is included in the apparatus for scanning, for example, an object 50 by means of the electron beam. The detector device preferably comprises two detector pairs 40 which are symmetrically arranged with respect to the electron beam and which have boundaries 51 facing the beam axis. When the electron beam extends axially, both detector halves of each pair receive the same quantity of electrons. This equilibrium is disturbed in reaction to any deflection of the beam, so it is advantageous to use a difference signal of the two detectors as a control signal for the deflection device.

An interrupted line 52 indicates how a displacement of the source 42 to a point 53 causes a deviation 54 in the final image 55. This deviation can be compensated for by way of the dispersion disc 56 which is now asymmetrically arranged. Compensation is again necessary for any rotation of the image between the detector plane and the image plane. These detector pairs need not be arranged exactly in the condenser image plane, and the two pairs need not be situated in the same plane.

If desired, an electron beam which is tilted about a fixed point can be made to be incident perpendicularly on an object to be examined. The feasible positions of the detection device as well as the beam deflection device shown here enable the building in of a beam correction device also in a scanning electron microscope utilizing reflection.

In a further preferred embodiment, the beam correction device in accordance with the invention forms part of an electron beam machining apparatus. In apparatus of this kind it is desirable that an exactly defined position can be imparted to an image of the electron source, for example, for manufacturing or finishing an integrated circuit or for other material working involving microscopically small dimensions. A beam corrective device will then substantially improve the reproducibility and the accuracy of the machining apparatus. Similarly, the resolution of an electron beam recording apparatus for the microrecording of information will be increased by using a beam correction device in accordance with the invention. As a result, a better-defined or reduced recording can be achieved.

What is claimed is:

1. Electron beam apparatus, comprising:
   an electron-optical lens system for forming a final image of an object with an electron beam, said system also forming with the electron beam at least one intermediate image of the object;
   electron detection apparatus at the periphery of the intermediate image for detecting the difference between the actual position of the intermediate image and a reference position, said detection apparatus producing a signal indicative of the difference; and
   beam deflection apparatus responsive to said signal for automatically deflecting the electron beam in a direction which compensates for the difference, whereby the position of the final image of the object is thereby stabilized against movements of the object relative to the electron-optical lens system.

2. Electron beam apparatus as defined in claim 1 wherein the intermediate image is formed by a first lens, the final image is formed by a second lens, the field of view of said first lens being greater than the field of view of said second lens and said electron detection apparatus is positioned in a portion of the intermediate image which is not within the field of view of said second lens.

3. Electron beam apparatus as defined in claim 2 wherein said electron-optical lens system is part of a transmission electron microscope.

4. Electron beam apparatus as defined in claim 1 wherein said electron-optical lens system is part of a scanning electron microscope.

5. Electron beam apparatus as defined in claim 4 wherein said scanning electron microscope comprises a first beam deflection device for scan deflection of the electron beam and a second beam deflection device in synchronism with said first beam deflection device for counteracting the scan deflection, said electron detection apparatus being positioned at an intermediate image plane behind said second beam deflection device.

6. Electron beam apparatus as defined in claim 5 wherein said beam deflection apparatus comprises one of said beam deflection devices.

7. Electron beam apparatus as defined in claim 1 wherein said electron detection apparatus comprises a pair of parallel detectors, the difference between the signals therefrom being indicative of the difference between the actual and reference positions of the intermediate image in a direction perpendicular to said pair of parallel detectors.

8. Electron beam apparatus as defined in claim 7 wherein said electron detection apparatus comprises a second pair of parallel detectors perpendicular to the first pair of parallel detectors for producing signals the difference between being indicative of the difference between the actual and reference positions of the intermediate image in a second direction perpendicular to the first direction.

9. Electron beam apparatus as defined in claim 1 wherein said electron-optical lens system is part of an electron beam machining apparatus.

* * * * *